(12) United States Patent
Nagai

(10) Patent No.: US 7,791,091 B2
(45) Date of Patent: Sep. 7, 2010

(54) SEMICONDUCTOR LIGHT-EMITTING DEVICE, LIGHT-EMITTING MODULE AND LIGHTING UNIT

(75) Inventor: Hideo Nagai, Osaka (JP)

(73) Assignee: Panasonic Corporation, Osaka (JP)

( * ) Notice: Subject to any disclaimer, the term of this patent is extended or adjusted under 35 U.S.C. 154(b) by 602 days.

(21) Appl. No.: 11/720,981

(22) PCT Filed: Dec. 7, 2005

(86) PCT No.: PCT/JP2005/022906

§ 371 (c)(1),
(2), (4) Date: Jun. 6, 2007

(87) PCT Pub. No.: WO2006/062239

PCT Pub. Date: Jun. 15, 2006

(65) Prior Publication Data

US 2009/0224278 A1    Sep. 10, 2009

(30) Foreign Application Priority Data

Dec. 10, 2004  (JP) .............................. 2004-358455

(51) Int. Cl.
*H01L 33/00* (2010.01)
(52) U.S. Cl. ............................ 257/94; 257/99; 257/676; 257/E33.066
(58) Field of Classification Search ................. 257/94, 257/98, 99, 676, E33.066
See application file for complete search history.

(56) References Cited

U.S. PATENT DOCUMENTS

| 7,495,322 B2 * | 2/2009 | Hashimoto et al. .......... 257/676 |
| 2004/0095782 A1 | 5/2004 | Isoda |
| 2009/0173960 A1 * | 7/2009 | Martin et al. ................. 257/98 |

FOREIGN PATENT DOCUMENTS

| DE | 199 28 576 | 1/2001 |
| JP | 11-40848 | 2/1999 |
| WO | 2004/105142 | 12/2004 |

\* cited by examiner

*Primary Examiner*—Trung Dang
(74) *Attorney, Agent, or Firm*—Hamre, Schumann, Mueller & Larson, P.C.

(57) ABSTRACT

A semiconductor light-emitting device (1) includes a semiconductor multilayer film (11), a base material (12) for supporting the semiconductor multilayer film (11), a first feed terminal (17a), and a second feed terminal (17b). A protruding portion (12c) is formed on the back surface (12b) of the base material (12) that is opposite to the principal surface (12a) facing the semiconductor multilayer film (11). The first and second feed terminals (17a, 17b) are formed in contact with at least one selected from the portions (12d) of the back surface (12b) other than the protruding portion (12c) and the sides (12e) of the base material (12). The end face (121c) of the protruding portion (12c) is insulated electrically from the first and second feed terminals (17a, 17b). With this configuration, the semiconductor light-emitting device can improve the heat dissipation and achieve high integration easily.

16 Claims, 9 Drawing Sheets

SEMICONDUCTOR LIGHT-EMITTING DEVICE, LIGHT-EMITTING MODULE AND LIGHTING UNIT

TECHNICAL FIELD

The present invention relates to a semiconductor light-emitting device, and a light-emitting module and a lighting unit that use the semiconductor light-emitting device.

BACKGROUND ART

A GaN light-emitting diode (referred to as "LED" in the following) generally includes a semiconductor multilayer film that is formed by the crystal growth of a III-V group nitride semiconductor, expressed by a general formula of $B_zAl_xGa_{1-x-y-z}In_yN_{1-v-w}As_vP_w$ ($0 \leq x \leq 1$, $0 \leq y \leq 1$, $0 \leq z \leq 1$, $0 \leq x+y+z \leq 1$, $0 \leq v \leq 1$, $0 \leq w \leq 1$, $0 \leq v+w \leq 1$), on a single crystal substrate such as a sapphire substrate. When a current flows through this semiconductor multilayer film, the GaN light-emitting diode can emit light in the wide range of ultraviolet to infrared regions (e.g., 200 nm to 1700 nm). In particular, a LED for emitting light in a wavelength region shorter than greenish blue is being developed at present.

Above all, a blue LED for emitting blue light is combined with a phosphor that emits yellow light or red light by excitation of the blue light, and can be used as a white LED for emitting white light (e.g., JP 11(1999)-40848 A). The white LED can have a longer life compared with incandescent lamps or halogen lamps and thus is expected to replace the existing lighting sources in the future.

As an example of a semiconductor light-emitting device including the white LED, FIG. 8 shows the cross section of a semiconductor light-emitting device disclosed in JP 11 (1999)-40848 A. As shown in FIG. 8, a semiconductor light-emitting device 100 includes a sapphire substrate 101, a semiconductor multilayer film 102 that is formed in contact with the sapphire substrate 101 and constitutes a blue LED, a Si substrate 103 that supports the semiconductor multilayer film 102, and a phosphor layer 104 that is formed on the Si substrate 103 to cover the sapphire substrate 101. An electric insulating film 105 and a conductor pattern 106 are formed in this order on the Si substrate 103. The conductor pattern 106 is connected electrically to the semiconductor multilayer film 102 via bumps 107 and an electrode 108.

The semiconductor light-emitting device 100 with the above configuration can be applied to a lighting unit generally in the following manner. As shown in FIG. 9, many semiconductor light-emitting devices 100 (although FIG. 9 illustrates only one of them) are mounted on a mounting board 201 to form a light-emitting module 200. This light-emitting module 200 is used as a light source of a lighting unit (not shown). In FIG. 9, the light-emitting module 200 includes the mounting board 201, a reflecting plate 203 that is fixed on the mounting board 201 via an adhesive layer 202 with a hollow 203a inside, the semiconductor light-emitting device 100 that is placed in the hollow 203a of the reflecting plate 203 and mounted on the mounting board 201, and a lens 204 that is formed on the mounting board 201 to cover the semiconductor light-emitting device 100 and the reflecting plate 203. The mounting board 201 includes a metal layer 205, and a first electric insulating layer 206, a wiring 207 and a second electric insulating layer 208 that are stacked in this order on the metal layer 205. The wiring 207 of the mounting board 201 and the conductor pattern 106 of the semiconductor light-emitting device 100 are connected electrically by a bonding wire 209.

However, the light-emitting module 200 is required to ensure a region for positioning the bonding wire 209. This may interfere with high integration of the semiconductor light-emitting device 100. Therefore, it would be difficult to increase the luminous flux of light produced by the light-emitting module 200.

As shown in FIG. 10, a light-emitting module 300 may be configured by using an AlN substrate 301 instead of the Si substrate 103 (see FIG. 8) and via conductors 302 instead of the bonding wire 209 (see FIG. 9) to connect the wiring 207 and the conductor pattern 106 electrically. In this case, however, there is a gap G between the AlN substrate 301 and the mounting board 201 (the first electric insulating layer 206), and thus heat generated from the semiconductor multilayer film 102 is not likely to be dissipated efficiently.

DISCLOSURE OF INVENTION

With the foregoing in mind, the present invention provides a semiconductor light-emitting device that can improve heat dissipation and achieve high integration easily, and a light-emitting module and a lighting unit that use the semiconductor light-emitting device.

A semiconductor light-emitting device of the present invention includes the following: a semiconductor multilayer film in which a first conductive-type layer, a light-emitting layer, and a second conductive-type layer are formed in the indicated order, and the second conductive-type layer is arranged on the light extraction side of the light-emitting layer; a base material for supporting the semiconductor multilayer film; a first feed terminal connected electrically to the first conductive-type layer; and a second feed terminal connected electrically to the second conductive-type layer. A protruding portion is formed on the back surface of the base material that is opposite to the principal surface facing the semiconductor multilayer film. The first feed terminal and the second feed terminal are formed in contact with at least one selected from the back surface other than the protruding portion and the sides of the base material. The end face of the protruding portion is insulated electrically from the first feed terminal and the second feed terminal.

A light-emitting module of the present invention includes a mounting board and the semiconductor light-emitting device of the present invention that is mounted on the mounting board. The mounting board and the end face of the protruding portion of the semiconductor light-emitting device are joined together.

A lighting unit of the present invention includes the light-emitting module of the present invention as a light source.

DESCRIPTION OF THE INVENTION

Figure 1A:
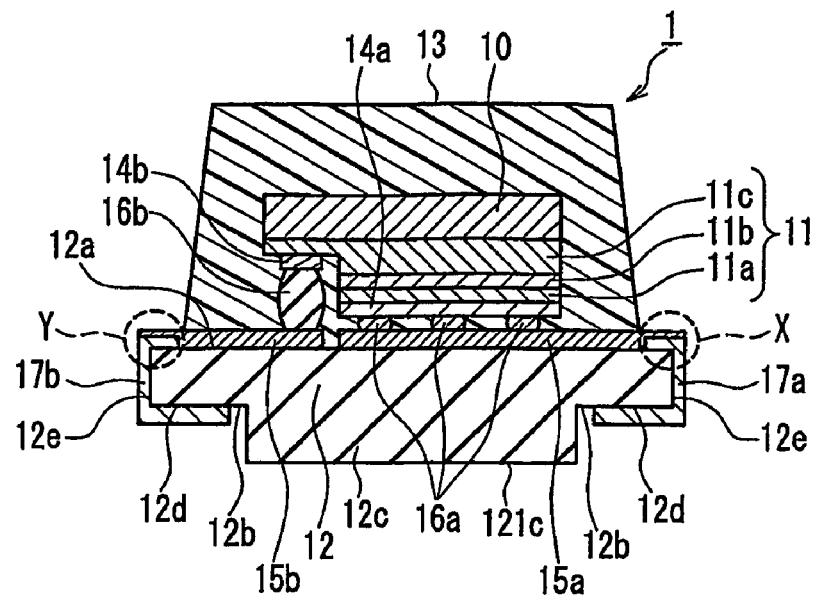
FIG. 1A is a cross-sectional view of a semiconductor light-emitting device of Embodiment 1 of the present invention.

A semiconductor light-emitting device of the present invention includes the following: a semiconductor multilayer film in which a first conductive-type layer, a light-emitting layer, and a second conductive-type layer are formed in the indicated order, and the second conductive-type layer is arranged on the light extraction side of the light-emitting layer; a base material for supporting the semiconductor multilayer film, a first feed terminal connected electrically to the first conductive-type layer, and a second feed terminal connected electrically to the second conductive-type layer.

The semiconductor multilayer film has a diode structure in which the first conductive-type layer, the light-emitting layer, and the second conductive-type layer are formed in this order. The first conductive-type layer is a p-type or n-type semiconductor layer. As the first conductive-type layer, e.g., a p-GaN layer (p-type semiconductor layer) or n-GaN layer (n-type semiconductor layer) can be used. The material of the light-emitting layer is preferably a material that can emit light having a wavelength of 450 to 470 nm, and also may be a material that can emit light having a wavelength of 410 nm or less. A specific example of the light-emitting layer may be an InGaN/GaN quantum well light-emitting layer. The second conductive-type layer is a semiconductor layer whose conductive type is opposite to the first conductive-type layer. For example, when the first conductive-type layer is a p-type semiconductor layer, the second conductive-type layer is an n-type semiconductor layer. Like the first conductive-type layer, a p-GaN layer (p-type semiconductor layer) or n-GaN layer (n-type semiconductor layer) can be used as the second conductive-type layer. The thicknesses of the p-type semiconductor layer, the light-emitting layer, and the n-type semiconductor layer may be, e.g., 0.1 to 0.5 µm, 0.01 to 0.1 µm, and 0.5 to 3 µm, respectively. Each of the first conductive-type layer, the light-emitting layer, and the second conductive-type layer may be composed of either a single layer or multiple layers. For the multiple layers, the layers can be made of different materials.

The semiconductor light-emitting device of the present invention may include a single crystal substrate (thickness: about 0.01 to 0.5 mm) such as a GaN substrate that is formed in contact with the principal surface of the first or second conductive-type layer and used in crystal growth of the semiconductor multilayer film. Moreover, the semiconductor multilayer film may be formed by depositing the n-type semiconductor layer, the light-emitting layer, and the p-type semiconductor layer in this order on a single crystal substrate such as a sapphire substrate by crystal growth, and subsequently removing the single crystal substrate.

Although the material of the base material is not particularly limited, the thermal conductivity of the material is preferably not less than 10 W/(m·K), more preferably not less than 20 W/(m·K), and most preferably not less than 100 W/(m·K). Examples of such a material include a semiconductor material such as Si or SiC and a ceramic material such as $Al_2O_3$ or AlN. In particular, AlN or high-purity Si is suitable because of their high thermal conductivity and favorable processability. If a conductive material (e.g., metal) or semiconductor material is used as the base material, it is possible to cover a region inside or on the surface of the base material where the electric insulating properties should be ensured with an electric insulating material such as a silicon oxide or silicon nitride.

When the semiconductor light-emitting device of the present invention is mounted on a mounting board to form a light-emitting module, the first and second feed terminals are connected electrically, e.g., to a wiring included in the mounting board. The material of the first and second feed terminals may be, e.g., a general conductive material such as Ti/Au. The thickness of the first and second feed terminals may be, e.g., 0.5 to 3 µm.

In the semiconductor light-emitting device of the present invention, a protruding portion is formed on the back surface of the base material that is opposite to the principal surface facing the semiconductor multilayer film. Accordingly, when the semiconductor light-emitting device is mounted on the mounting board to form a light-emitting module, the protruding portion and the mounting board are joined together. Therefore, heat generated from the semiconductor multilayer film of the semiconductor light-emitting device can be dissipated efficiently to the mounting board through the protruding portion. Thus, e.g., the light-emitting module can have a longer life. If the life of the light-emitting module is approximately the same as that of a conventional light-emitting module, the driving current can be set higher than the conventional light-emitting module. Thus, e.g., the luminous flux of light produced by the light-emitting module can be increased.

In the semiconductor light-emitting device of the present invention, the first and second feed terminals are formed in contact with at least one selected from the back surface other than the protruding portion and the sides of the base material. Accordingly, when the semiconductor light-emitting device is mounted on the mounting board, the first and second feed terminals are connected electrically to the wiring included in the mounting board by using solder or the like instead of a bonding wire. Therefore, high integration of the semiconductor light-emitting device becomes easier. Thus, e.g., the luminous flux of light produced by the light-emitting module can be increased. Moreover, many semiconductor light-emitting devices can be mounted simultaneously on the mounting board by reflowing or the like, so that man-hours can be reduced compared with a wire bonding method that requires connection work for each bonding wire.

In the semiconductor light-emitting device of the present invention, the end face of the protruding portion is insulated electrically from the first and second feed terminals. Accordingly, feeding from the first and second feed terminals can be performed while heat is dissipated to the mounting board through the protruding portion.

To obtain the above effects reliably in the semiconductor light-emitting device of the present invention, it is preferable that the height of the protruding portion is 0.05 to 0.5 mm. The area of the end face of the protruding portion is preferably not less than 50% of the entire area of the back surface, and more preferably not less than 75%. The thickness of the base material other than the protruding portion may be, e.g., 0.1 to 1 mm.

A method for forming the protruding portion of the base material is not particularly limited as long as the end face of the protruding portion is insulated electrically from the first and second feed terminals. For example, a sheet material made of an electric insulating material (e.g., $Al_2O_3$, AlN, or high-purity Si) may be bonded with a protruding portion made of the same electric insulating material by hot pressing or the like. Moreover, a sheet material made of a conductive material (e.g., metal such as Al) may be bonded with a protruding portion made of an electric insulating material (e.g., $Al_2O_3$, AlN, or high-purity Si) by hot pressing or the like. Alternatively, the protruding portion may be formed by bonding a sheet material made of a conductive material with a protrusion made of a conductive material by hot pressing, and subsequently applying an electric insulating material to the end face of the protrusion.

A light-emitting module of the present invention includes a mounting board and the semiconductor light-emitting device of the present invention that is mounted on the mounting board. The mounting board and the end face of the protruding portion of the semiconductor light-emitting device are joined together. Accordingly, as with the case described above, this light-emitting module can have, e.g., a longer life and a higher luminous flux of light to be produced. The number of semiconductor light-emitting modules mounted on the mounting board is not particularly limited, and may be determined appropriately depending on the desired amount of light.

The mounting board is not particularly limited, and may be, e.g., a metal substrate, a ceramic substrate, a laminated substrate of a metal layer and an electric insulating layer (e.g., a composite sheet including an inorganic filler and a thermosetting resin), or a composite substrate formed by combining these substrates. In the mounting board, it is preferable that a material having a high thermal conductivity such as a metallic material or ceramic material is used in a region that comes into contact with the end face of the protruding portion of the semiconductor light-emitting device. This allows heat generated from the semiconductor multilayer film to be dissipated efficiently. The thickness of the mounting board may be, e.g., about 1 to 2 mm.

In the light-emitting module of the present invention, the mounting board may have a fitting portion for fitting with the protruding portion, and the semiconductor light-emitting device may be mounted while the protruding portion fits into the fitting portion. This can improve the positioning accuracy of the semiconductor light-emitting device on the mounting board.

In the light-emitting module of the present invention, the mounting board and the end face of the protruding portion of the semiconductor light-emitting device may be joined together via a thermal conductive material. For example, even if the end face of the protruding portion or the surface of the mounting board is uneven, the thermal conductive material is present between the end face of the protruding portion and the mounting board, and thus can dissipate heat generated from the semiconductor multilayer film uniformly. In this case, the thermal conductivity of the thermal conductive material is preferably not less than 5 W/(m·K), and more preferably not less than 100 W/(m·K) to improve the heat dissipation. A specific example of the thermal conductive material may be silicon grease, solder, or a metallic thin film made of metal such as gold or copper. The thermal conductive material layer between the end face of the protruding portion and the mounting board may be thick enough to fill depressions in the end face of the protruding portion or the surface of the mounting board, and the thickness may be, e.g., about 1 to 10 μm.

A lighting unit of the present invention includes the light-emitting module of the present invention as a light source. Accordingly, as with the case described above, this lighting unit can have, e.g., a longer life and a higher luminous flux of light to be produced. Hereinafter, embodiments of the present invention will be described in detail.

Embodiment 1

Figure 1B:
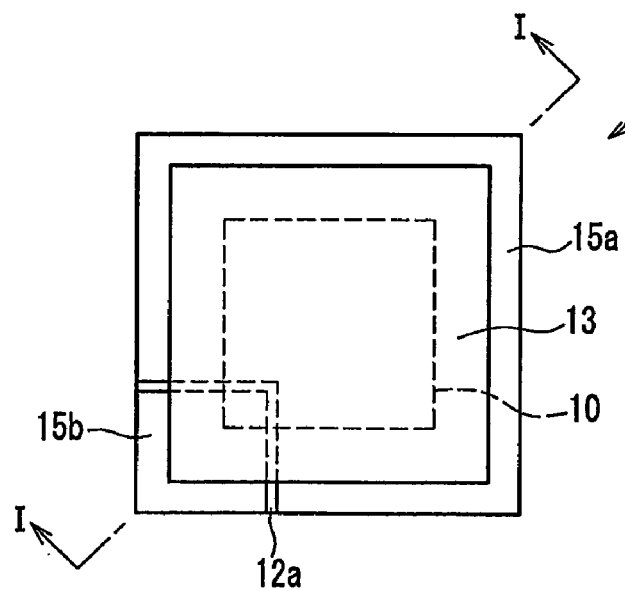
FIG. 1B is a schematic plan view of the semiconductor light-emitting device of Embodiment 1 of the present invention when viewed from the phosphor layer side.
Figure 1C:
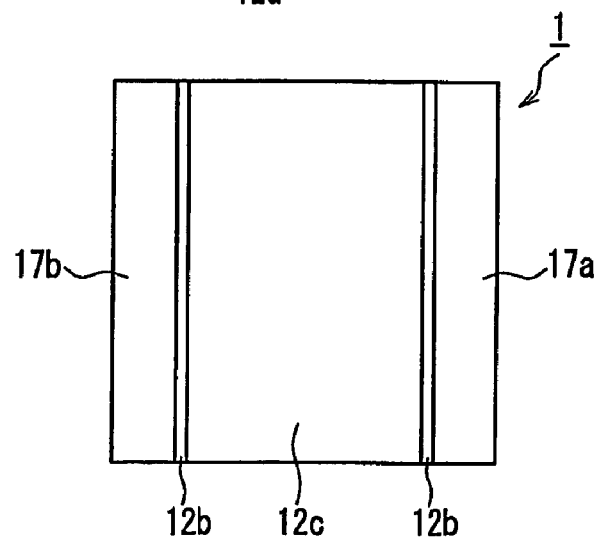
FIG. 1C is a schematic plan view of the semiconductor light-emitting device of Embodiment 1 of the present invention when viewed from the base material side.

A semiconductor light-emitting device of Embodiment 1 of the present invention will be described with reference to the drawings. FIG. 1 illustrates the semiconductor light-emitting device of Embodiment 1: FIG. 1A is a cross-sectional view of the semiconductor light-emitting device of Embodiment 1; FIG. 1B is a schematic plan view of the semiconductor light-emitting device of Embodiment 1 when viewed from the phosphor layer side; and FIG. 1C is a schematic plan view of the semiconductor light-emitting device of Embodiment 1 when viewed from the base material side. The cross section in FIG. 1A is viewed from the direction of the arrow I-I in FIG. 1B.

As shown in FIGS. 1A to 1C, the semiconductor light-emitting device 1 of Embodiment 1 includes a single crystal substrate 10, a semiconductor multilayer film 11 that is formed in contact with the single crystal substrate 10, a base material 12 that supports the semiconductor multilayer film 11, and a phosphor layer 13 that is formed on the base material 12 to cover the signal crystal substrate 10. In the semiconductor multilayer film 11, a first conductive-type layer 11a, a light-emitting layer 11b, and a second conductive-type layer 11c are formed in this order, and the second conductive-type layer 11c is arranged on the light extraction side of the light-emitting layer 11b.

The phosphor layer 13 includes a phosphor that absorbs light emitted from the light-emitting layer 11b and emits fluorescence (e.g., yellow light or red light of fluorescence). Examples of the phosphor for emitting yellow light include $(Sr, Ba)_2SiO_4:Eu^{2+}$ and $(Y, Gd)_3Al_5O_{12}:Ce^{3+}$. Examples of the phosphor for emitting red light include $(Ca, Sr)S:Eu^{2+}$ and $Sr_2Si_5N_8:Eu^{2+}$. The phosphor layer 13 can be formed in such a manner that a phosphor paste including a phosphor and a paste material (e.g., a silicone resin) is printed on the base material 12 by screen printing or the like. The average thickness of the phosphor layer 13 may be, e.g., 0.03 to 1 mm.

The semiconductor light-emitting device 1 has a first electrode 14a and a second electrode 14b that are formed in contact with the first conductive-type layer 11a and the second conductive-type layer 11c, respectively. Although the material of the first electrode 14a is not particularly limited, a preferred conductive material reflects the light emitted from the light-emitting layer 11b. This can improve the light extraction efficiency of the semiconductor light-emitting device 1. The conductive material may be, e.g., Rh/Pt/Au. The material of the second electrode 14b is not particularly limited, and a general conductive material such as Ti/Au can be used. The thickness of the first and second electrodes 14a, 14b may be, e.g., 0.5 to 3 μm.

Conductor patterns 15a, 15b are formed on a principal surface 12a of the base material 12 that faces the semiconductor multilayer film 11. The conductor pattern 16a is connected electrically to the first electrode 14a via bumps 16a. The conductor pattern 15b is connected electrically to the second electrode 14b via a bump 16b. Although the material of the conductor patterns 15a, 15b is not particularly limited, a preferred conductive material reflects the light emitted from the light-emitting layer 11b or the phosphor in the phosphor layer 13. The conductor patterns 15a, 15b can reflect the light traveling from the light-emitting layer 11b or the phosphor layer 13 back toward the base material 12 back toward the light extraction side, thereby improving the light extraction efficiency of the semiconductor light-emitting device 1. The conductive material may be, e.g., Ti/Pt/Al. The thickness of the conductive patterns 15a, 15b may be, e.g., 0.5 to 3 µm.

A protruding portion 12c is formed on a back surface 12b of the base material 12 that is opposite to the principal surface 12a. Accordingly, when the semiconductor light-emitting device 1 is mounted on a mounting board (not shown) to form a light-emitting module (not shown), the protruding portion 12c and the mounting board are joined together, as will be described later. Therefore, heat generated from the semiconductor multilayer film 11 of the semiconductor light-emitting device 1 can be dissipated efficiently to the mounting board through the protruding portion 12c. Thus, e.g., the light-emitting module can have a longer life.

In the semiconductor light-emitting device 1, a first feed terminal 17a and a second feed terminal 17b are formed, extending from portions 12d (referred to as "stepped portions" in the following) of the back surface 12b other than the protruding portion 12c, along the sides 12e of the base material 12, and to the principal surface 12a of the base material 12. The first feed terminal 17a is in contact with the conductor pattern 15a at the corner X of the base material 12. The second feed terminal 17b is in contact with the conductor pattern 15b at the corner Y of the base material 12. In other words, the first conductive-type layer 11a and the first feed terminal 17a are connected electrically via the first electrode 14a, the bumps 16a, and the conductor pattern 16a. The second conductive-type layer 11c and the second feed terminal 17b are connected electrically via the second electrode 14b, the bump 16b, and the conductor pattern 15b. This configuration can eliminate a bonding wire when the semiconductor light-emitting device 1 is mounted on a mounting board (not shown), as will be described later. Therefore, high integration of the semiconductor light-emitting device 1 becomes easier. Thus, e.g., the luminous flux of light produced by a light-emitting module (not shown) can be increased.

In this embodiment, the base material 12 including the protruding portion 12c is made of AlN. Therefore, an end face 121c of the protruding portion 12c is insulated electrically from the first and second feed terminals 17a, 17b. Thus, feeding from the first and second feed terminals 17a, 17b can be performed while heat is dissipated to the mounting board (not shown) through the protruding portion 12c.

The semiconductor light-emitting device of Embodiment 1 has been described above, but the present invention is not limited thereto. For example, although the principal surface of the base material 12 is substantially square in this embodiment, the present invention can use, e.g., a substrate with a polygonal principal surface such as a triangle, rectangle or hexagon or a substrate with a circular principal surface. The same is true for the single crystal substrate 10, the semiconductor multilayer film 11, and the phosphor layer 13. Moreover, the single crystal substrate is used in this embodiment. However, the single crystal substrate is not essential to the present invention. For example, the principal surface of the semiconductor multilayer film may come into direct contact with the phosphor layer.

Embodiment 2

Figure 2A:
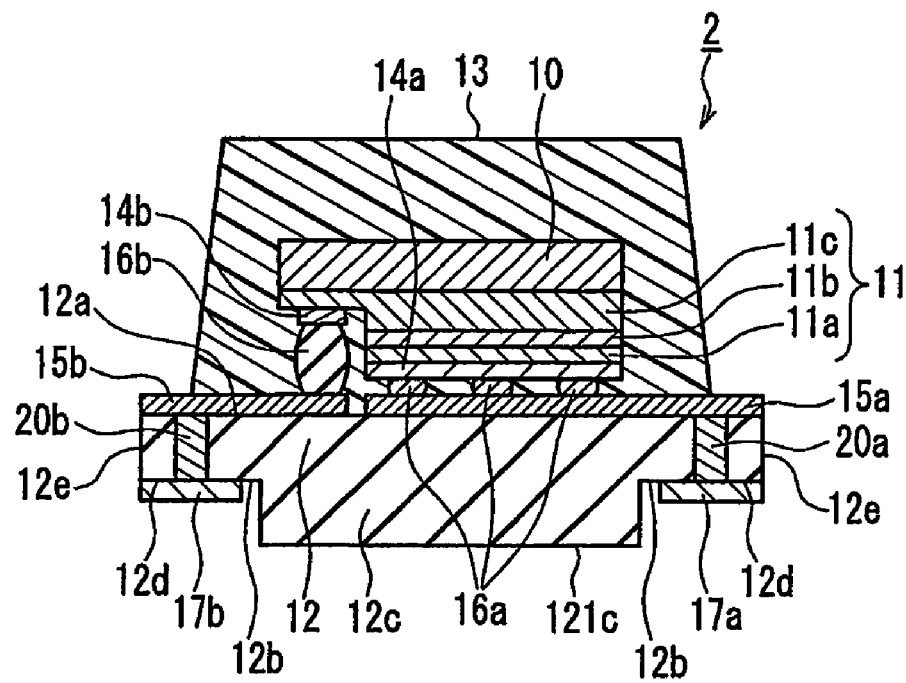
FIG. 2A is a cross-sectional view of a semiconductor light-emitting device of Embodiment 2 of the present invention.
Figure 2B:
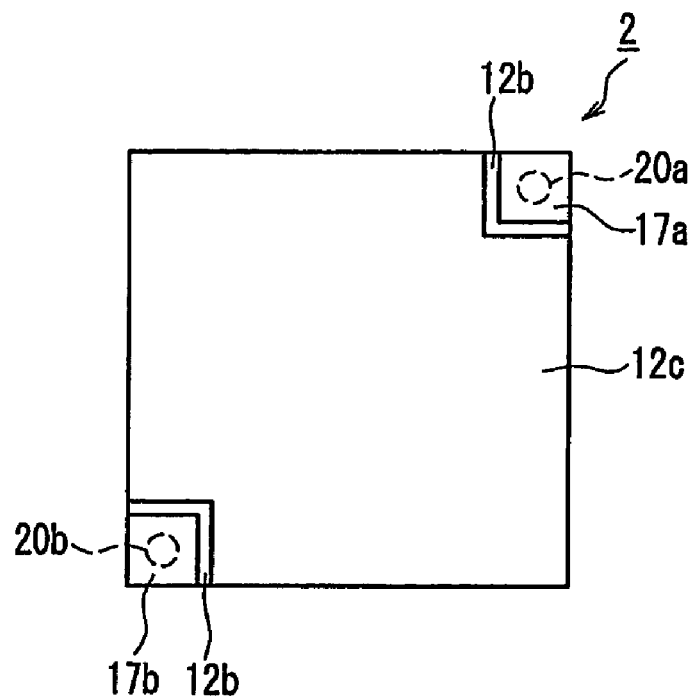
FIG. 2B is a schematic plan view of the semiconductor light-emitting device of Embodiment 2 of the present invention when viewed from the base material side.

A semiconductor light-emitting device of Embodiment 2 of the present invention will be described with reference to the drawings. FIG. 2 illustrates the semiconductor light-emitting device of Embodiment 2: FIG. 2A is a cross-sectional view of the semiconductor light-emitting device of Embodiment 2; and FIG. 2B is a schematic plan view of the semiconductor light-emitting device of Embodiment 2 when viewed from the base material side. The same components as those in FIG. 1 are denoted by the same reference numerals, and the explanation will not be repeated.

In the semiconductor light-emitting device 2 of Embodiment 2, as shown in FIGS. 2A and 2B, a first feed terminal 17a and a second feed terminal 17b are provided on the stepped portions 12d that are formed in the corners of the back surface 12b of the base material 12. Unlike the semiconductor light-emitting device 1 of Embodiment 1 (see FIG. 1), the first and second feed terminals 17a, 17b come into contact with neither the sides 12e nor the principal surface 12a of the base material 12, and are connected electrically to the conductor patterns 15a, 15b through via conductors 20a, 20b, respectively. The via conductors 20a, 20b are formed in the thickness direction of the base material 12. The other features are the same as those of the semiconductor light-emitting device 1 of Embodiment 1. Therefore, the semiconductor light-emitting device 2 of Embodiment 2 also can have an effect comparable to that of the semiconductor light-emitting device 1 of Embodiment 1. As the via conductors 20a, 20b, e.g., via holes may be formed in the base material 12 and filled with a metallic material such as Pt or Cu by plating. The diameter of the via conductors 20a, 20b may be, e.g., 20 to 200 µm.

As described above, the semiconductor light-emitting devices of Embodiments 1 and 2 have been taken as an example of the semiconductor light-emitting device of the present invention, but the present invention is not limited to those embodiments. For example, although each of the semiconductor light-emitting devices of Embodiments 1 and 2 includes the phosphor layer, a semiconductor light-emitting device may not have to include the phosphor layer. When the phosphor layer is not used, the material of the light-emitting layer may be, e.g., an AlGaInP-based material for emitting red light or a GaAs-based material for emitting light that ranges from red to infrared.

Embodiment 3

Figure 3A:
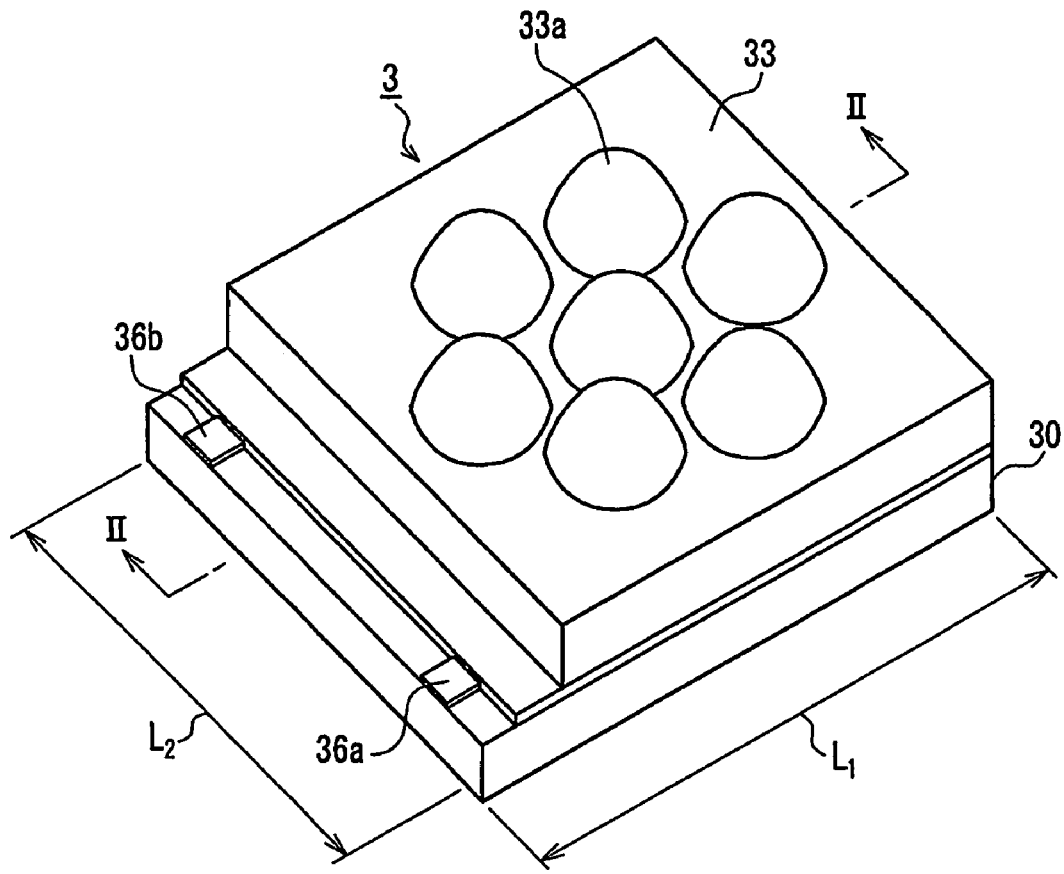
FIG. 3A is a schematic perspective view of a light-emitting module of Embodiment 3 of the present invention.
Figure 3B:
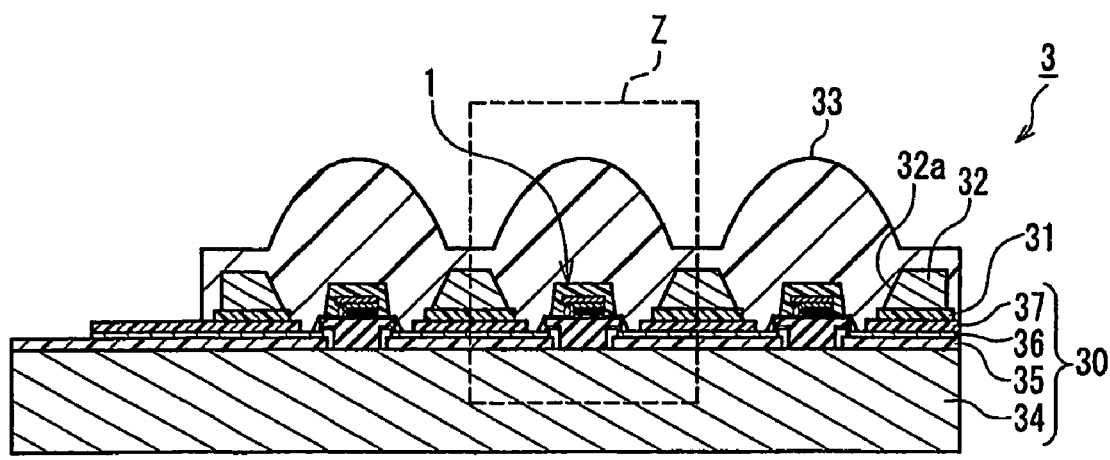
FIG. 3B is a cross-sectional view of the light-emitting module taken along the line II-II in FIG. 3A.
Figure 4:
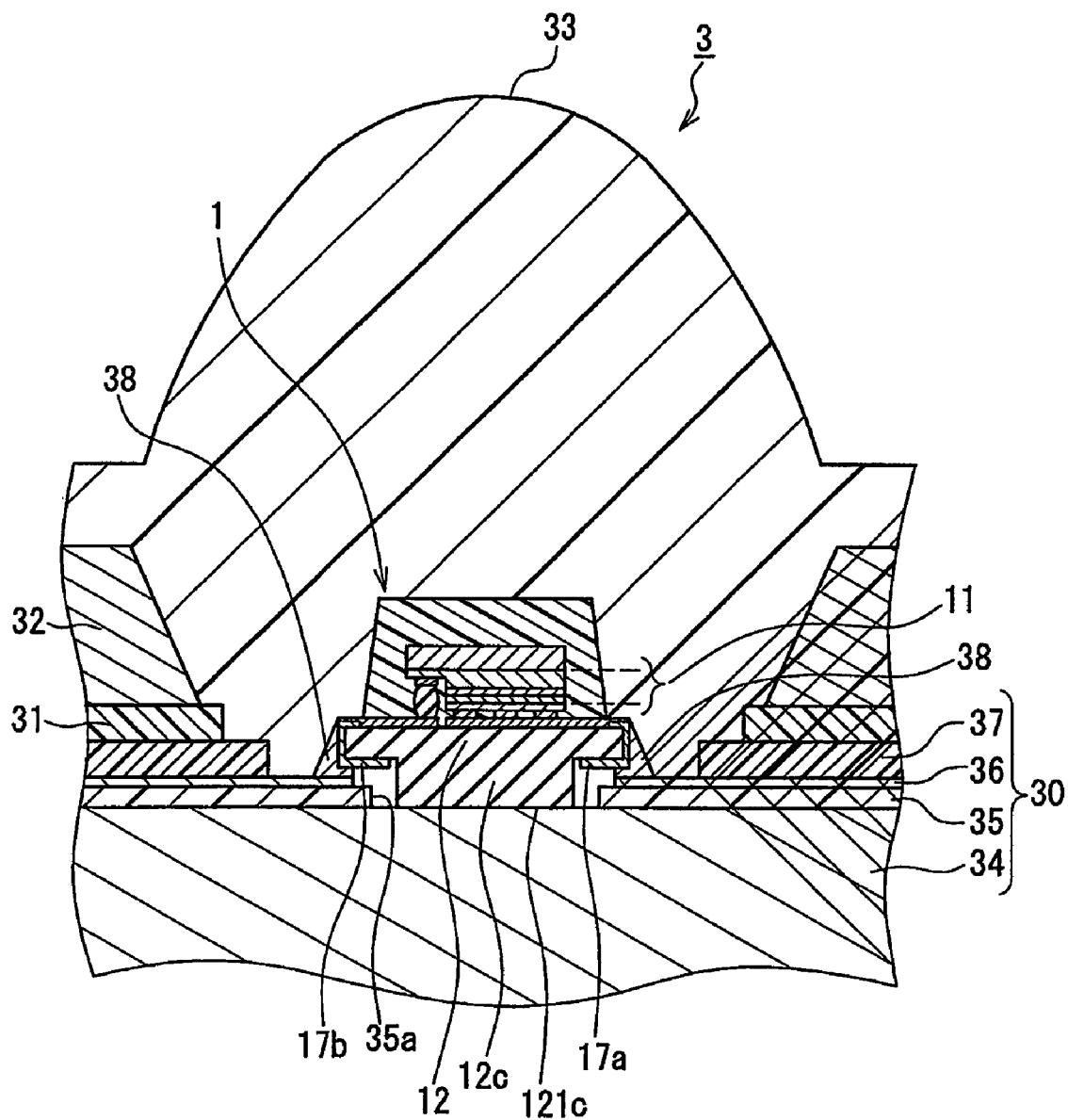
FIG. 4 is an enlarged view of a portion represented by Z in FIG. 3B.

A light-emitting module of Embodiment 3 of the present invention will be described by appropriately referring to the drawings. FIG. 3 illustrates the light-emitting module of Embodiment 3: FIG. 3A is a schematic perspective view of the light-emitting module of Embodiment 3; and FIG. 3B is a cross-sectional view of the light-emitting module taken along the line II-II in FIG. 3A. FIG. 4 is an enlarged view of a portion represented by Z in FIG. 3B. The light-emitting module of Embodiment 3 includes the semiconductor light-emitting device 1 of Embodiment 1. The same components as those in FIG. 1 are denoted by the same reference numerals, and the explanation will not be repeated.

As shown in FIGS. 3A and 3B, the light-emitting module 3 of Embodiment 3 includes a mounting board 30, reflecting plates 32, each of which is fixed on the mounting board 30 via an adhesive layer 31 with a hollow 32a inside, seven semiconductor light-emitting devices 1, each of which is placed in the hollow 32a of the reflecting plate 32 and mounted on the mounting board 30, and lenses 33, each of which is formed on the mounting board 30 to cover the semiconductor light-emitting device 1 and the reflecting plate 32.

As shown in FIG. 4, the mounting board 30 includes a metal layer 34, and a first electric insulating layer 35, a wiring 36 and a second electric insulating layer 37 that are stacked in this order on the metal layer 34. The ends of the wiring 36 are terminals 36a, 36b in FIG. 3A. A fitting portion 35a for fitting with the protruding portion 12c of the semiconductor light-emitting device 1 is provided between the neighboring first electric insulating layers 35. The semiconductor light-emitting device 1 is mounted while the protruding portion 12c fits into the fitting portion 35a. This can improve the positioning accuracy of the semiconductor light-emitting device 1 on the mounting board 30. The wiring 36 of the mounting board 30 is connected electrically to the first and second feed terminals 17a, 17b via solder 38. Therefore, the light-emitting module 3 does not use a bonding wire and can facilitate high integration of the semiconductor light-emitting device 1. Thus, e.g., the luminous flux of light produced by the light-emitting module 3 can be increased.

The metal layer 34 of the mounting board 30 and the end face 121c of the protruding portion 12c of the semiconductor light-emitting device 1 are joined together via a thermal conductive material (not shown). Therefore, heat generated from the semiconductor multilayer film 11 of the semiconductor light-emitting device 1 can be dissipated efficiently to the metal layer 34 through the protruding portion 12c. Thus, e.g., the light-emitting module 3 can have a longer life.

Next, the result of evaluating the heat dissipation of the light-emitting module 3 will be described below. The light-emitting module 3 used for the evaluation included a semiconductor light-emitting device 1 (see FIG. 1) having the following configuration. The base material 12 was a 2 mm square AlN base material (the height of the protruding portion 12c was 0.1 mm, the area of the end face 121c of the protruding portion 12c was 3 mm$^2$, and the thickness of the base material 12 other than the protruding portion 12c was 0.25 mm). The phosphor layer 13 had an average height of 0.4 mm when measured from the conductor patterns 15a, 15b and an average diameter of 1.8 mm. The first conductive-type layer 11a was a p-GaN layer. The light-emitting layer 11b was an InGaN/GaN quantum well light-emitting layer. The second conductive-type layer 11c was an n-GaN layer. The semiconductor multilayer film 11 had a thickness of 3 μm. The signal crystal substrate 10 was a 1 mm square GaN substrate (thickness: 0.2 mm).

Moreover, the light-emitting module 3 used for the evaluation included a mounting board 30 (see FIG. 4) having the following configuration. The metal layer 34 was an aluminum plate (thickness: 1 mm). The first and second electric insulating layers 35, 37 were made of a composite material including an epoxy resin and alumina (thickness: 0.05 mm). The size of the mounting board 30 was defined so that the length ($L_1$) in the longitudinal direction and the length ($L_2$) in the lateral direction of FIG. 3A were 28 mm and 24 mm, respectively.

The light-emitting module 3 used for the evaluation included a reflecting plate 32 (see FIG. 4) that was made of aluminum and had a thickness of 1 mm. An adhesive layer 31 that was present between the reflecting plate 32 and the mounting board 30 was an epoxy resin and had a thickness of 0.05 mm. Moreover, the light-emitting module 3 used for the evaluation included a lens 33 that was made of a hard silicone resin. The convex portion 33a (see FIG. 3A) of the lens 33 had a maximum thickness of 5 mm. A thermal conductive material that was present between the metal layer 34 of the mounting board 30 and the end face 121c of the protruding portion 12c was silicon grease.

Figure 10:
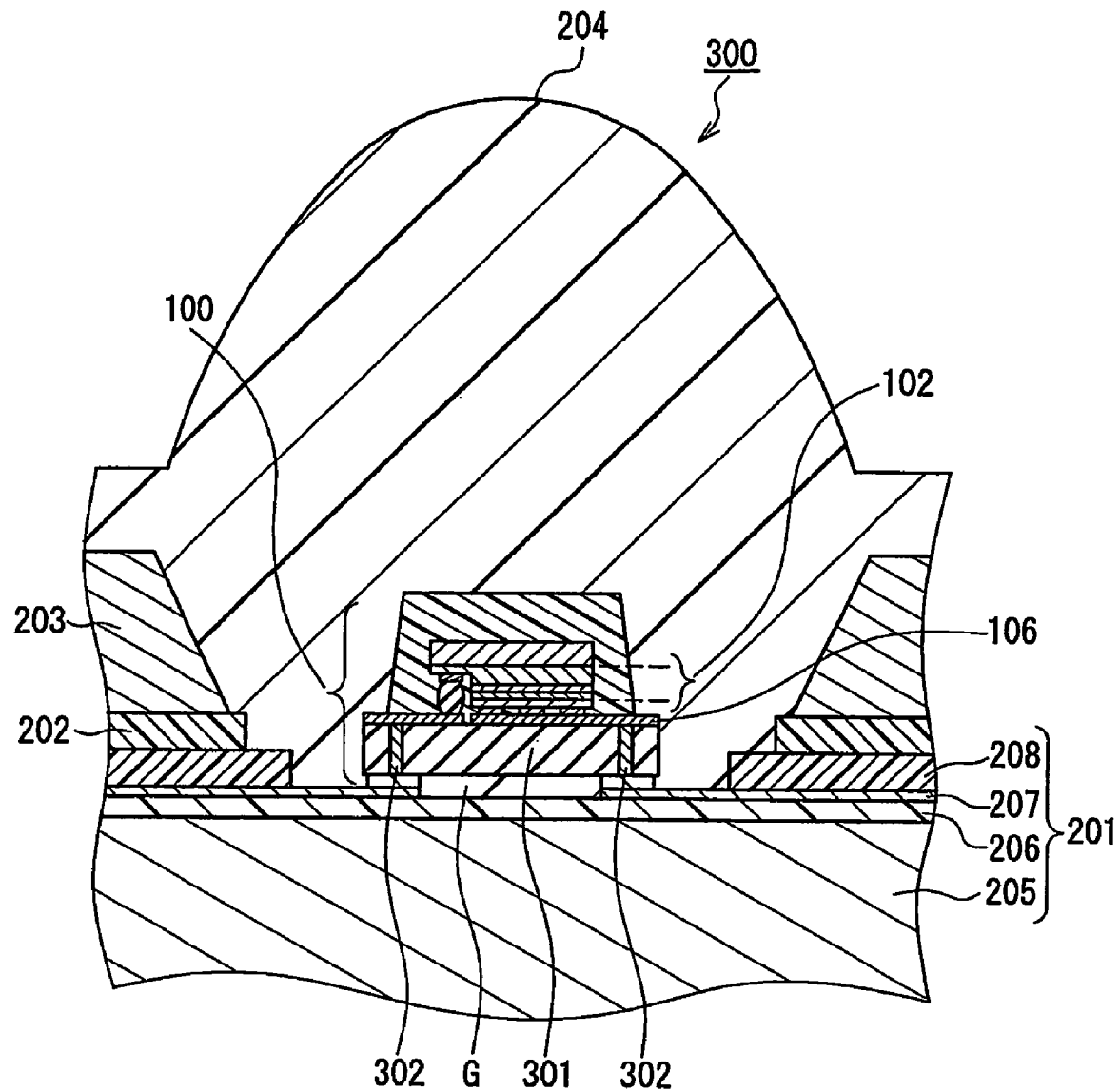
FIG. 10 is a cross-sectional view of a modified example of the light-emitting module in FIG. 9.

Using the light-emitting module 3 with the above configuration, a thermal resistance from the light-emitting layer 11b (see FIG. 1A) of the semiconductor light-emitting device 1 to the bottom surface of the metal layer 34 (see FIG. 4) of the mounting board 30 was calculated, and the resultant value was 0.1 K/W. For comparison, a thermal resistance of the light-emitting module 300 (see FIG. 10) was calculated in the same manner, and the resultant value was 2.5 K/W. The light-emitting module 300 used for comparison included via conductors 302 (see FIG. 10) that were made of copper and had a diameter of 200 μm. In the light-emitting module 300, a gap G (see FIG. 10) formed between the AlN substrate 301 and the first electric insulating layer 206 was 0.03 mm. The material, thickness, or the like of the remaining components were the same as those of the light-emitting module 3.

Embodiment 4

Figure 5:
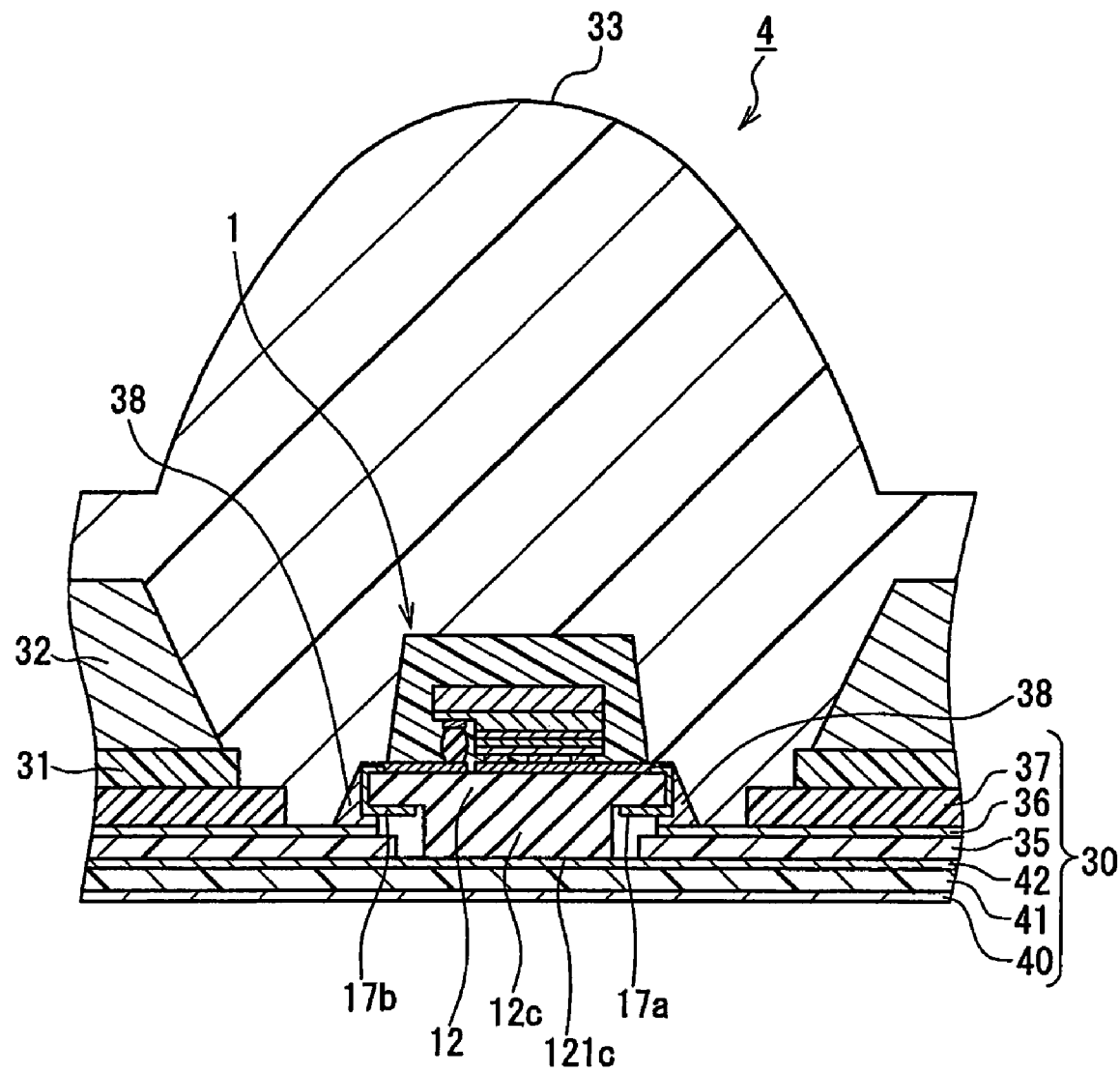
FIG. 5 is a cross-sectional view of a light-emitting module of Embodiment 4 of the present invention.

A light-emitting module of Embodiment 4 of the present invention will be described by appropriately referring to the drawings. FIG. 5 is a cross-sectional view of the light-emitting module of Embodiment 4 and corresponds to FIG. 4 showing the light-emitting module 3 of Embodiment 3. The light-emitting module of Embodiment 4 includes the semiconductor light-emitting device 1 of Embodiment 1. The same components as those in FIG. 4 are denoted by the same reference numerals, and the explanation will not be repeated.

Instead of the metal layer 34 (see FIG. 4) of the light-emitting module 3 of Embodiment 3, as shown in FIG. 5, the light-emitting module 4 of Embodiment 4 uses a first metal foil layer 40, a glass-epoxy material layer 41, and a second metal foil layer 42 that are stacked in this order. The second metal foil layer 42 of the mounting board 30 and the end face 121c of the protruding portion 12c of the semiconductor light-emitting device 1 are joined together via a thermal conductive material (not shown). The other features are the same as those of the light-emitting module 3 of Embodiment 3. Therefore, the light-emitting module 4 of Embodiment 4 also can have an effect comparable to that of the light-emitting module 3 of Embodiment 3. As the first and second metal foil layers 40, 42, e.g., a copper foil having a thickness of 5 to 25 μm can be used. The thickness of the glass-epoxy material layer 41 may be, e.g., 50 to 100 μm.

Embodiment 5

Figure 6:
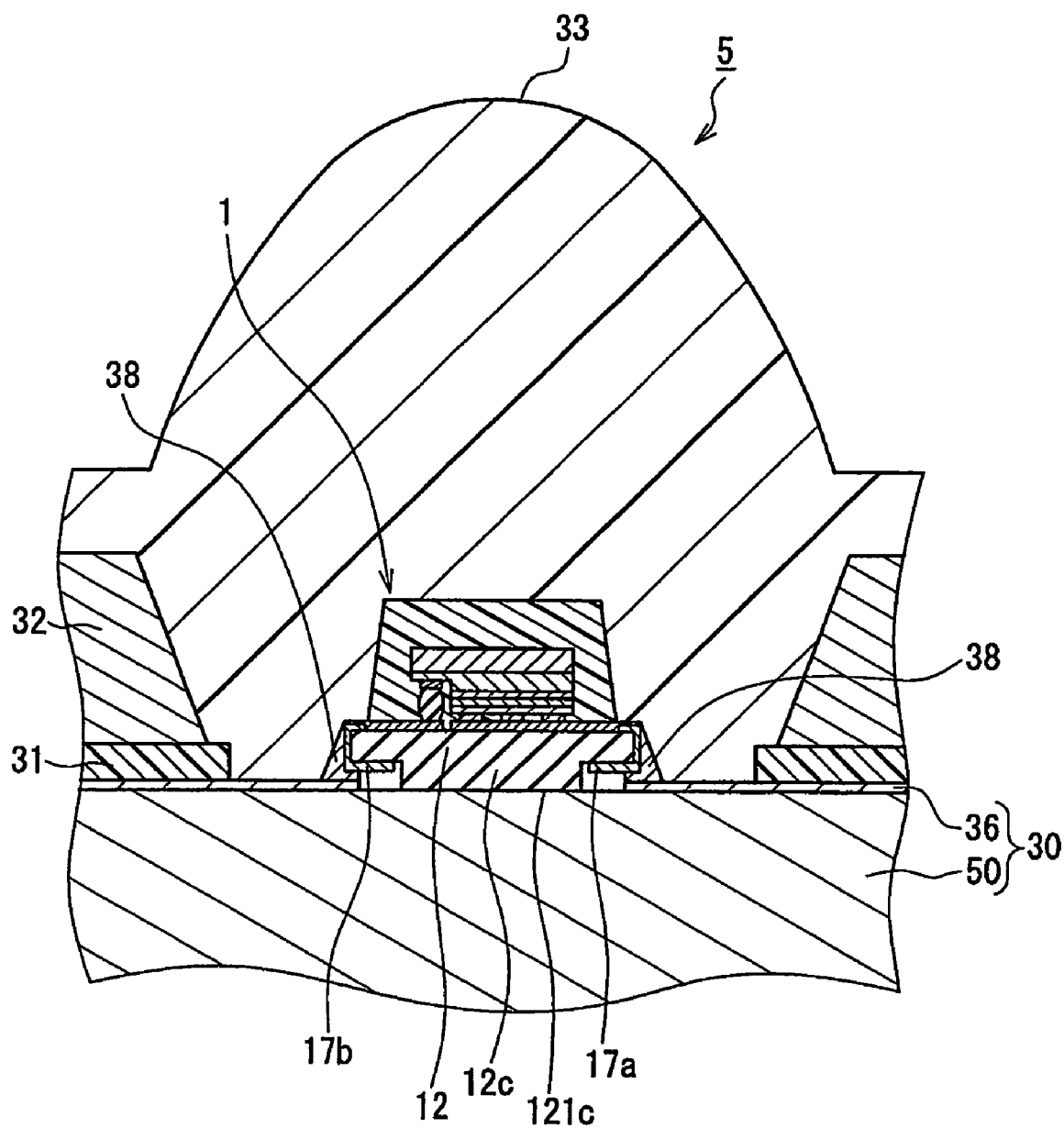
FIG. 6 is a cross-sectional view of a light-emitting module of Embodiment 5 of the present invention.

A light-emitting module of Embodiment 5 of the present invention will be described by appropriately referring to the drawings. FIG. 6 is a cross-sectional view of the light-emitting module of Embodiment 5 and corresponds to FIG. 4 showing the light-emitting module 3 of Embodiment 3. The light-emitting module of Embodiment 5 includes the semiconductor light-emitting device 1 of Embodiment 1. The same components as those in FIG. 4 are denoted by the same reference numerals, and the explanation will not be repeated.

In the light-emitting module 5 of Embodiment 5, the mounting board 30 includes a ceramic layer 50 made of a ceramic material such as AlN and a wiring 36 formed on the ceramic layer 50, as shown in FIG. 6. The ceramic layer 50 of the mounting board 30 and the end face 121c of the protruding portion 12c are joined together via a thermal conductive material (not shown). The other features are the same as those of the light-emitting module 3 of Embodiment 3. Therefore, the light-emitting module 5 of Embodiment 5 also can have an effect comparable to that of the light-emitting module 3 of Embodiment 3. The thickness of the ceramic layer 50 may be, e.g., 0.5 to 2 mm.

As described above, the light-emitting modules of Embodiments 3 to 5 have been taken as an example of the light-emitting module of the present invention, but the present invention is not limited to those embodiments. For example, although each of the light-emitting modules of Embodiments 3 to 5 includes the semiconductor light-emitting device 1 of Embodiment 1, a light-emitting module may include the semiconductor light-emitting device 2 of Embodiment 2. Moreover, the mounting board and the end face of the protruding portion may be brought into direct contact without using the thermal conductive material as long as they can be joined together (i.e., the contact surface between them is flat).

Embodiment 6

Figure 7:
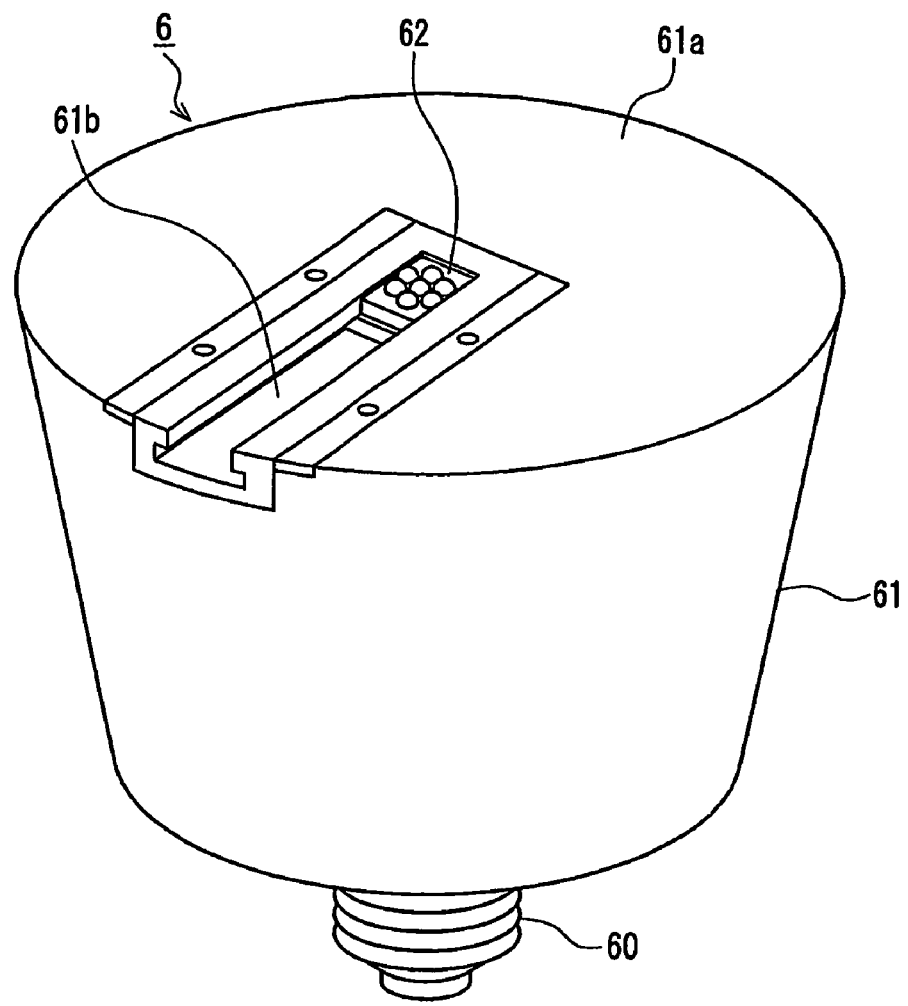
FIG. 7 is a schematic perspective view of a lighting unit of Embodiment 6 of the present invention.
Figure 8:
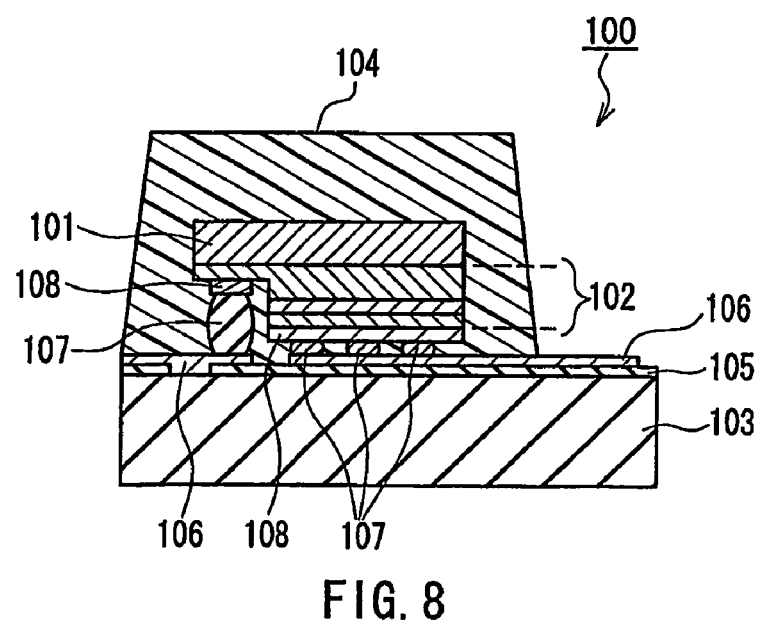
FIG. 8 is a cross-sectional view of a conventional semiconductor light-emitting device.
Figure 9:
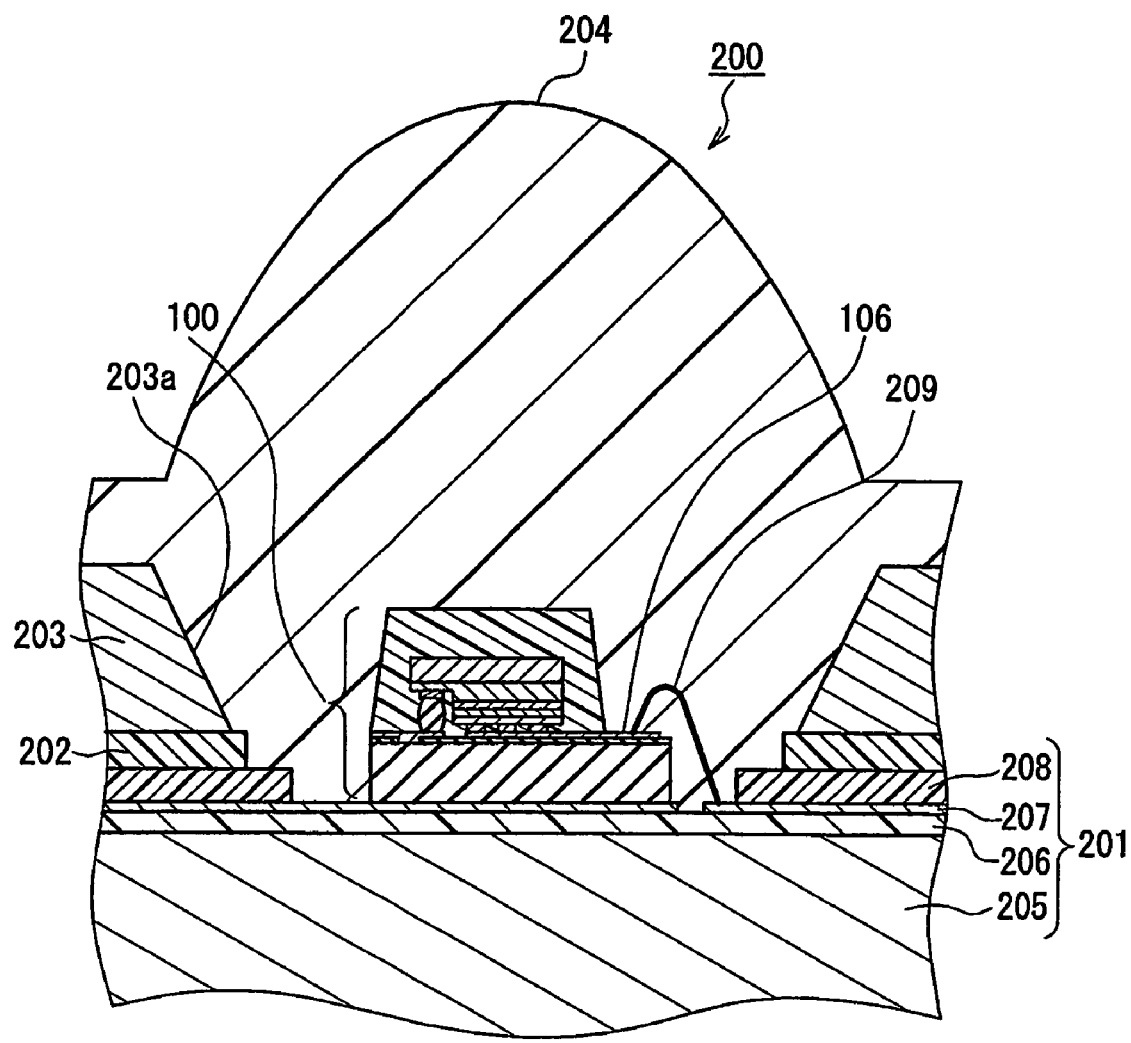
FIG. 9 is a cross-sectional view of a conventional light-emitting module.

A lighting unit of Embodiment 6 of the present invention will be described by appropriately referring to the drawings. FIG. 7 is a schematic perspective view of the lighting unit of Embodiment 6. The lighting unit of Embodiment 6 includes the light-emitting module of any one of Embodiments 3 to 5 as a light source.

As shown in FIG. 7, the lighting unit 6 of Embodiment 6 includes a base 60 that screws into a standard incandescent lamp socket, a case 61 that is fixed at the end of the base, the light-emitting module 62 that is attached to the case 61, and a driving circuit (not shown) for driving the light-emitting module 62.

The case 61 has a housing portion 61b for attachment of the light-emitting module 62, and the housing portion 61b is formed in the end face 61a of the case 61 that is opposite to the base 60. The light-emitting module 62 is housed in the housing portion 61b. Moreover, a feeing portion (not shown) connected to the driving circuit is placed in the housing portion 61b and can supply a predetermined driving current to the light-emitting module 62.

The lighting unit 6 with the above configuration includes the light-emitting module 62 of any one of Embodiments 3 to 5 as a light source, and thus can achieve, e.g., a longer life and a higher luminous flux of light to be produced.

INDUSTRIAL APPLICABILITY

The present invention can be applied suitably for any light source used in the field of lighting or the like.

The invention claimed is:

1. A semiconductor light-emitting device comprising:
a semiconductor multilayer film in which a first conductive-type layer, a light-emitting layer, and a second conductive-type layer are formed in the indicated order, and the second conductive-type layer is arranged on a light extraction side of the light-emitting layer;
a base material for supporting the semiconductor multilayer film;
a first electrode formed in contact with the first conductive-type layer;
a second electrode formed in contact with the second conductive-type layer;
a first feed terminal connected electrically to the first conductive-type layer; and
a second feed terminal connected electrically to the second conductive-type layer,
wherein a first conductor pattern and a second conductor pattern are formed on a principal surface of the base material that faces the semiconductor multilayer film,
the first conductor pattern is connected electrically to the first electrode,
the second conductor pattern is connected electrically to the second electrode,
a protruding portion is formed on a back surface of the base material that is opposite to a principal surface facing the semiconductor multilayer film,
stepped portions are formed in corners of the back surface other than the protruding portion,
the first feed terminal and the second feed terminal are provided on the stepped portions,
the first feed terminal is connected electrically to the first conductor pattern through a first via conductor that is formed in a first through-hole formed in the base material,
the second feed terminal is connected electrically to the second conductor pattern through a second via conductor that is formed in a second through-hole formed in the base material, and
an end face of the protruding portion is insulated electrically from the first feed terminal and the second feed terminal.

2. The semiconductor light-emitting device according to claim 1, wherein a height of the protruding portion is 0.05 to 0.5 mm.

3. A light-emitting module comprising:
a mounting board; and
the semiconductor light-emitting device according to claim 1 that is mounted on the mounting board,
wherein the mounting board and the end face of the protruding portion of the semiconductor light-emitting device arc joined together.

4. The light-emitting module according to claim 3, wherein the mounting board has a fitting portion for fitting with the protruding portion, and the semiconductor light-emitting device is mounted while the protruding portion fits into the fitting portion.

5. The light-emitting module according to claim 3, wherein the mounting board and the end face of the protruding portion are joined together via a thermal conductive material.

6. The light-emitting module according to claim 5, wherein a thermal conductivity of the thermal conductive material is 5 W/(m·K) or more.

7. A lighting unit comprising:
the light-emitting module according to claim 3 as a light source.

8. The semiconductor light-emitting device according to claim 1, wherein an area of an end face of the protruding portion is 75% or more of an entire area of the back surface of the base material.

9. The semiconductor light-emitting device according to claim 1, wherein the first conductor pattern is connected electrically to the first electrode via a bump, and the second conductor pattern is connected electrically to the second electrode via a bump.

10. The semiconductor light-emitting device according to claim 1, further comprising a phosphor layer including a phosphor that absorbs light emitted from the light-emitting layer and emits fluorescence,
wherein the phosphor layer is formed to cover the semiconductor multilayer film.

11. The semiconductor light-emitting device according to claim 1, wherein the first electrode is made of a conductive material that reflects light emitted from the light-emitting layer.

12. The semiconductor light-emitting device according to claim 1, wherein the first conductor pattern and the second conductor pattern are made of a conducive material that reflects light emitted from the light-emitting layer.

13. The semiconductor light-emitting device according to claim 1, wherein a thermal conductivity of a constituent material of the base material is 10 W/(m·K) or more.

14. The semiconductor light-emitting device according to claim 1, wherein a thermal conductivity of a constituent material of the base material is 20 W/(m·K) or more.

15. The semiconductor light-emitting device according to claim 1, wherein a thermal conductivity of a constituent material of the base material is 100 W/(m·K) or more.

16. The semiconductor light-emitting device according to claim 1, wherein the base material is made of at least one material selected from the group consisting of Si, SiC, $Al_2O_3$, and AlN

* * * * *